United States Patent
Muri et al.

(10) Patent No.: US 11,139,125 B2
(45) Date of Patent: Oct. 5, 2021

(54) POWER RELAY CIRCUIT

(71) Applicant: Infineon Technologies Austria AG, Villach (AT)

(72) Inventors: Ingo Muri, Villach (AT); Christian Fachmann, Fuernitz (AT)

(73) Assignee: Infineon Technologies Austria AG, Villach (AT)

( * ) Notice: Subject to any disclaimer, the term of this patent is extended or adjusted under 35 U.S.C. 154(b) by 46 days.

(21) Appl. No.: 16/678,747

(22) Filed: Nov. 8, 2019

(65) Prior Publication Data

US 2020/0161062 A1    May 21, 2020

(30) Foreign Application Priority Data

Nov. 15, 2018 (EP) ..................... 18206559

(51) Int. Cl.
*H01H 9/54* (2006.01)
*H01H 1/00* (2006.01)
*H01H 47/02* (2006.01)
*H01H 59/00* (2006.01)
*H01H 71/00* (2006.01)

(52) U.S. Cl.
CPC .......... *H01H 9/548* (2013.01); *H01H 1/0036* (2013.01); *H01H 47/02* (2013.01); *H01H 59/0009* (2013.01); *H01H 2071/008* (2013.01); *H03K 2217/0063* (2013.01)

(58) Field of Classification Search
CPC .................. H01H 47/02; H01H 47/001; H01H 2061/006; H01H 59/0009; H01H 2071/008; H01H 2057/006; H01H 9/548; H01H 9/542; H01H 9/30; H01H 1/0036; H03K 2217/0063; H01L 2224/16225; H01L 27/0251; H01L 2924/19105
See application file for complete search history.

(56) References Cited

U.S. PATENT DOCUMENTS

| | | | |
|---|---|---|---|
| 7,737,810 B2* | 6/2010 | Chan | H01H 59/0009 335/78 |
| 7,864,491 B1 | 1/2011 | Bauder et al. | |
| 8,597,985 B1 | 12/2013 | Chanchani et al. | |
| 2010/0014199 A1 | 1/2010 | Kawa et al. | |
| 2011/0308924 A1* | 12/2011 | Kishore | H01H 1/0036 200/181 |
| 2014/0361387 A1* | 12/2014 | Meyer | B81C 1/00333 257/415 |
| 2015/0140736 A1* | 5/2015 | Pendse | H01L 24/00 438/109 |
| 2017/0117110 A1* | 4/2017 | Liu | H01H 59/0009 |
| 2017/0283247 A1 | 10/2017 | Meyer et al. | |
| 2018/0045782 A1* | 2/2018 | Muller | H01H 9/548 |

FOREIGN PATENT DOCUMENTS

| | | |
|---|---|---|
| EP | 1681694 A1 | 7/2006 |
| WO | 2017070103 A1 | 4/2017 |

* cited by examiner

*Primary Examiner* — Bryan R Perez
(74) *Attorney, Agent, or Firm* — Murphy, Bilak & Homiller, PLLC (57) ABSTRACT

A power relay circuit for switching a load current includes a micro-electro-mechanical system (MEMS) switch and a semiconductor power switch. The MEMS switch and the semiconductor power switch are connected in series with the load current.

11 Claims, 7 Drawing Sheets

POWER RELAY CIRCUIT

TECHNICAL FIELD

This disclosure relates to the field of power switching, and in particular to the technique of switching a load current by a power relay.

BACKGROUND

Power relays are power switches used to control a power circuit by a low-power control signal. Power transistors as well as micro-electro-mechanical system (MEMS) switches could be used as power relays. While MEMS switches provide for galvanic isolation and low electrical resistance, power transistors are inexpensive to manufacture and allow for high integration densities and short switching times.

SUMMARY

A power relay circuit for switching a load current includes a micro-electro-mechanical system (MEMS) switch and a semiconductor power switch. The MEMS switch and the semiconductor power switch are connected in series with the load current.

An embedded wafer level packaging (eWLP) relay package includes the power relay circuit. The MEMS switch and the semiconductor power switch are stacked on wafer level before eWLP relay package singularization.

A method of switching a load current by a power relay circuit comprising a MEMS switch and a semiconductor power switch is disclosed. The MEMS switch and the semiconductor power switch are connected in series with the load current. The method comprises disconnecting the power relay circuit by switching the semiconductor power switch to OFF and, thereafter, switching the MEMS switch to OFF. Additionally or alternatively, the method comprises connecting the power relay circuit by switching the MEMS switch to ON and, thereafter, switching the semiconductor power switch to ON.

A method of manufacturing an embedded wafer level packaging (eWLP) relay package, the eWLP relay package comprising a power relay circuit for switching a load current, is disclosed. The method comprises providing a first wafer including a plurality of semiconductor power switches, and providing, on the first wafer, a second wafer including a plurality of MEMS switches. The eWLP relay package is singularized from the stacked first and second wafers, wherein the eWLP relay package comprises at least one MEMS switch and at least one semiconductor power switch which are connected in series with the load current.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

It is to be understood that the features of the various exemplary embodiments and examples described herein may be combined with each other, unless specifically noted otherwise.

As used in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface.

The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Figure 1:
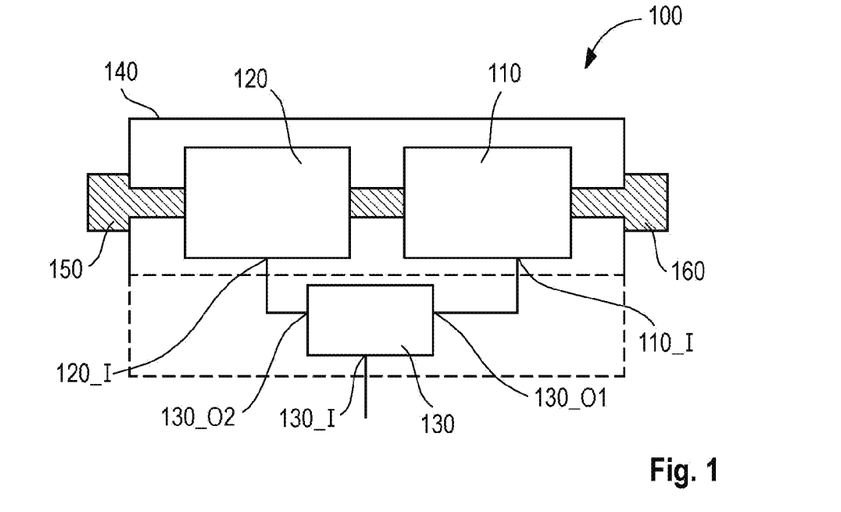
FIG. 1 is a schematic diagram of an exemplary power relay circuit including a MEMS switch and a semiconductor power switch connected in series.

FIG. 1 illustrates a schematic of a power relay circuit 100 for switching a load current. The power relay circuit 100 may include a MEMS switch 110 and a semiconductor power switch 120. The MEMS switch 110 and the semiconductor power switch 120 are connected in series with the load current.

The power relay circuit 100 may be accommodated in a relay package 140. The relay package 140 may be equipped with a first external terminal 150 and a second external terminal 160. The first and second external terminals 150, 160 may be the terminals through which the load current (which is switched by the power relay circuit 100) enters and leaves the relay package 140. The first external terminal 150 is connected with the semiconductor power switch 120 and the second external terminal 160 is connected with the MEMS switch 110.

By way of example, the first external terminal 150 may be a low side (LS) terminal while the second external terminal 160 may be a high side (HS) terminal.

The relay package 140 may further include a driver circuit 130. The driver circuit 130 may be configured to control an ON-OFF control input 110_I of the MEMS switch 110 and may be configured to control an ON-OFF control input 120_I of the semiconductor power switch 120.

More specifically, the driver circuit 130 may have a first output 130_O1 coupled to the ON-OFF control input 110_I of the MEMS switch 110, and may have a second output 130_O2 coupled to the ON-OFF control input 120_I of the semiconductor power switch 120.

The driver circuit 130 may have a power relay circuit control input 130_I to receive a relay control signal. The relay control signal may control the state of the power relay circuit 100, i.e. may control whether the power relay circuit 100 is in a disconnected state in which the first external terminal 150 and the second external terminal 160 are electrically disconnected or whether the power relay circuit 100 is in a connected state in which the first external terminal 150 and the second external terminal 160 are electrically connected.

As indicated by the dashed lines showing possible outlines of the relay package 140, the driver circuit 130 may either be an integral part of the relay package 140 or may be external to the relay package 140. While in the first case, the power relay circuit control input 130_I may be an external control input of the relay package 140, in the second case the ON-OFF control input 120_I of the semiconductor power switch 120 and the ON-OFF control input 110_I of the MEMS switch 110 may constitute external terminals of the relay package 140.

It is to be noted that in the example of FIG. 1, the semiconductor power switch 120 is arranged at the LS terminal, while the MEMS switch 110 is arranged at the HS terminal. However, throughout the entire disclosure, the order of the MEMS switch 110 and the semiconductor power switch 120 in the series connection may be interchanged, i.e. the MEMS switch 110 may be located adjacent to the LS terminal (which is then the second external terminal 160) and the semiconductor power switch 120 may be located adjacent to the HS terminal (which is then the first external terminal 150).

Figure 2:
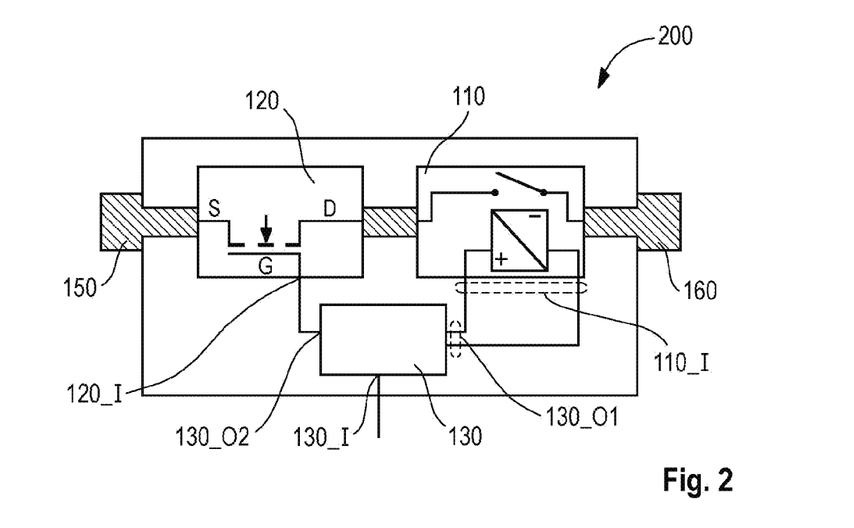
FIG. 2 is a more detailed schematic diagram of the exemplary power relay circuit of FIG. 1.

FIG. 2 illustrates an exemplary power relay circuit 200. The exemplary power relay circuit 200 may be identical to the power relay circuit 100 except that a more detailed illustration of the semiconductor power switch 120 and the MEMS switch 110 is depicted.

More specifically, the semiconductor power switch 120 may, for example, be configured as including one or more MISFETs (Metal Insulator Semiconductor Field Effect Transistors), MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), or bipolar transistors. D denotes the drain (or collector) electrode, G denotes the gate electrode and S denotes the source (or emitter) electrode of the integrated circuit (IC) representing the semiconductor power switch 120.

In FIG. 2, the semiconductor power switch 120 is exemplified as comprising a N-channel MOSFET of the enhancement type (normally-off). Other possibilities are that the semiconductor power switch 120 comprises a N-channel MOSFET of the depletion type (normally-on), a P-channel MOSFET of the enhancement type (normally-off) or a P-channel MOSFET of the depletion type (normally-on).

The semiconductor power switch 120 may, e.g., be implemented as an IC (e.g. chip) having a vertical structure, i.e. be fabricated in such a way that electric currents can flow in a direction perpendicular to the main surfaces of the IC. An IC having a vertical structure may have electrodes (die pads) on its two main surfaces, i.e. on its upper surface and its lower surface.

The semiconductor power switch 120 may, e.g., be implemented as an IC (e.g. chip) having a horizontal structure. An IC having a horizontal structure may have electrodes (die pads) only on one of its two main surfaces, e.g. on its active and/or upper surface. ICs such as power MISFETs or power MOSFETs or power JFETs or power HEMTs may have a horizontal structure.

An IC as comprised in the semiconductor power switch 120 may be manufactured from semiconductor material(s) such as, e.g., Si, SiC, SiGe, GaAs, GaN, AlGaN, InGaAs, InAlAs, etc., and may, e.g., contain inorganic and/or organic materials that are not semiconductors.

The MEMS switch 110 may, e.g., be an airgap-based MEMS switch. The airgap may be filled with a non-flammable insulation gas, e.g. $SF_6$. Airgap-based MEMS switches may, e.g., be of the cantilever type or membrane type. The airgap may, e.g., be switched by actuation, e.g. electrostatic actuation, electromagnetic actuation, piezoelectric actuation or thermal actuation.

The power relay circuit 100 may be designed as an LS switch or as an HS switch to a load (not shown) in an electrical circuit. If the power relay circuit 100 is designed as an LS switch, the load (not shown) is connected between the HS terminal of the power relay circuit 100 and battery voltage (VDD). If the power relay circuit 100 is designed as an HS switch, the load (not shown) is connected between ground (VSS) and the LS terminal of the power relay circuit 100.

Figure 3:
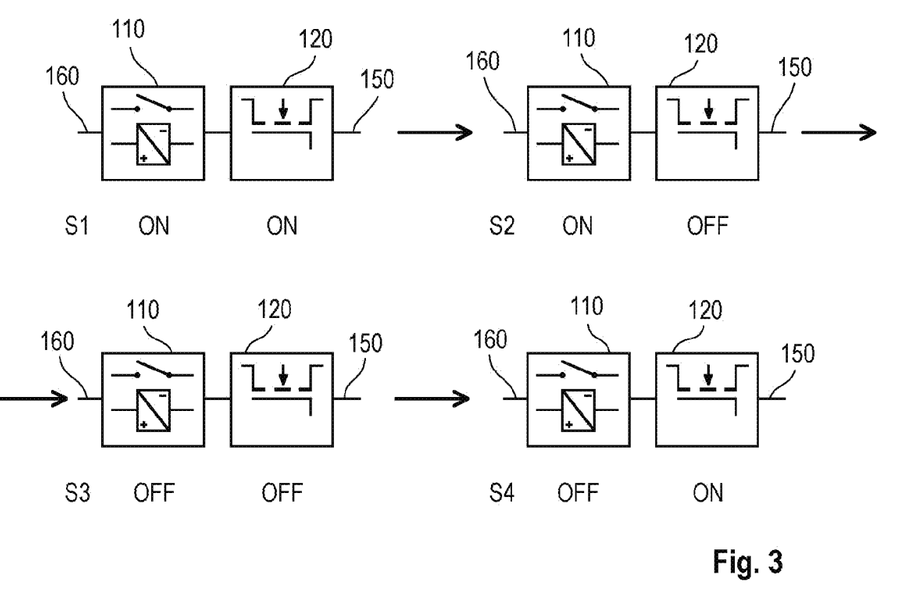
FIG. 3 is an illustration of an exemplary method of disconnecting a power relay circuit.

FIG. 3 illustrates an exemplary method of disconnecting the power relay circuit 100, 200. Disconnecting the power relay circuit 100, 200 means to electrically disconnect the first external terminal 150 and the second external terminal 160.

At S1 the MEMS switch 110 and the semiconductor power switch 120 are ON. That is, the power relay circuit 100, 200 is connected.

At S2 the semiconductor power switch 120 is turned OFF. Hence, the semiconductor power switch 120 takes the active role in initiating the disconnect operation. The current and the voltage at LS (here, e.g., coupled to the second terminal 160) are set to zero.

As soon as the current flow is interrupted, the MEMS switch 110 can be turned OFF at S3. Turning off the MEMS switch 110 is unproblematic since there is no voltage across the MEMS switch 110 at that time.

The power relay circuit 100 is now disconnected. Optionally, as illustrated at S4, the semiconductor power switch 120 may then be turned ON again. The full voltage drop is across the MEMS switch 110.

Figure 4:
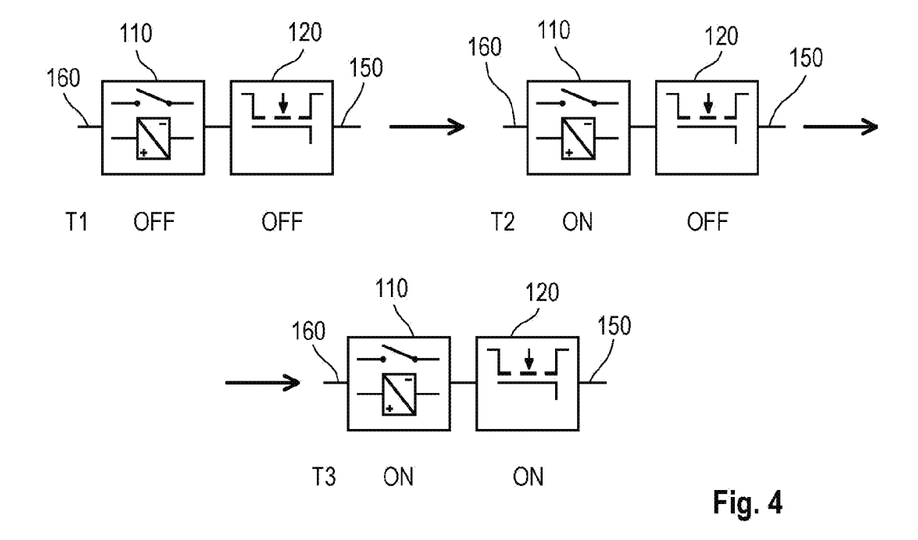
FIG. 4 is an illustration of an exemplary method of connecting a power relay circuit.

FIG. 4 illustrates an exemplary method of connecting the power relay circuit 100, 200. Connecting the power relay circuit 100, 200 means to electrically connect the first external terminal 150 and the second external terminal 160.

Initially, the MEMS switch 110 and the semiconductor power switch 120 may be OFF at T1.

In this case, the MEMS switch 110 is turned ON at T2. This results in that the semiconductor power switch 120, which is still OFF at that time, is again galvanically coupled to LS. The switching operation of the MEMS switch 110 at T2 is in a dead-voltage state, i.e. free from voltage. On the other hand, if the MEMS switch 110 is initially already ON (see the optional step of S4), then T1 is obsolete.

As soon as the semiconductor power switch 120 is galvanically coupled, the semiconductor power switch 120 may be turned ON at T3. At that time, the semiconductor power switch 120 resumes the active role of switching the power relay circuit 100.

The method of switching a load current, as exemplified in FIGS. 3 and 4, allows that the semiconductor power switch 120 is permanently galvanically decoupled from LS during OFF (at, e.g., S3, S4, T1).

As concerns the MEMS switch 110, the switching methods disclosed herein (see, e.g., FIGS. 3 and 4) allow that the MEMS switch 110 can always be switched in a state free from voltage. This allows to use less expensive MEMS switches 110 and/or to optimize the MEMS switches in terms of other characteristics than electrical robustness during switching, e.g. in terms of operating speed or miniaturization.

In short, the power relay circuit 100, 200 may provide for accurate and high speed switching while providing the advantage of galvanic isolation. It is to be noted that in FIGS. 3 and 4 the first external terminal 150 may, e.g., be a HS terminal while the second external terminal 160 may, e.g., be a LS terminal.

Power relay circuit deactivation and power relay circuit activation, as exemplified in FIGS. 3 and/or 4, may be controlled by the driver circuit 130. Upon receiving a power relay circuit control signal indicative of disconnecting the power relay circuit 100, 200, the driver circuit 130 may be configured to set the ON-OFF control input 120_I of the semiconductor power switch 120 to OFF. Thereafter, the driver circuit 130 may set the ON-OFF control input 110_I of the MEMS switch 110 to OFF.

After having set the ON-OFF control input 110_I of the MEMS switch 110 to OFF, the driver circuit 130 may set the ON-OFF control input 120_I of the semiconductor power switch 120 to ON.

Further, the driver circuit 130, upon receiving a power relay circuit control signal indicative of connecting the power relay circuit 100, may be configured to set the ON-OFF control input 110_I of the MEMS switch 110 to ON. Thereafter, the driver circuit 130 may set the ON-OFF control input 120_I of the semiconductor power switch 120 to ON.

Figure 5:
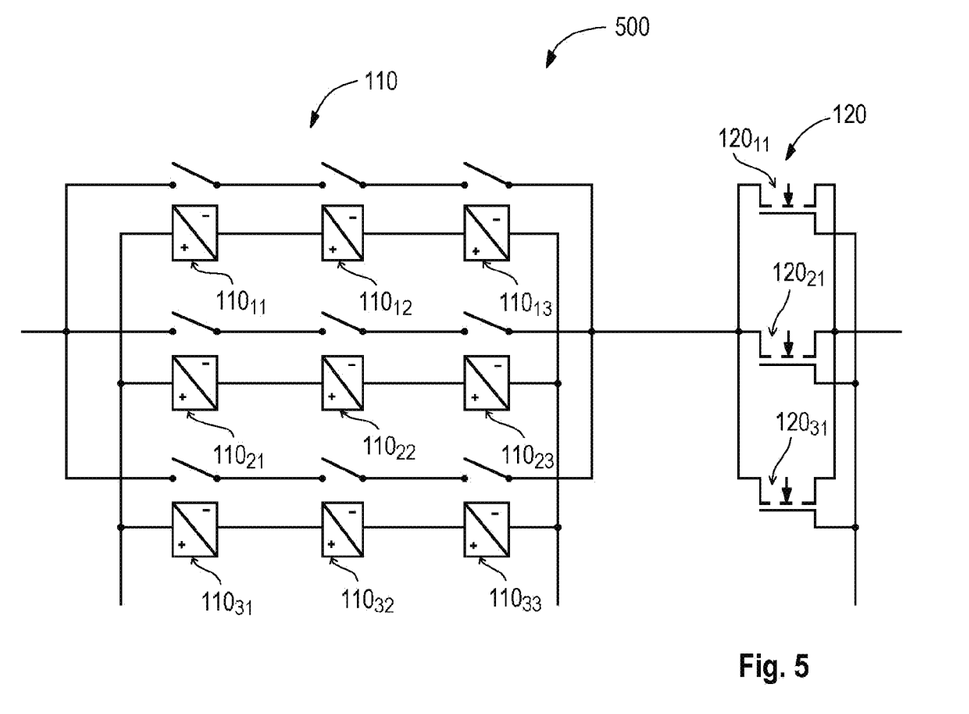
FIG. 5 is a schematic diagram of an exemplary power relay circuit including an array of individual MEMS switches and an array of individual semiconductor power switches.

FIG. 5 is a schematic diagram of an exemplary power relay circuit 500. The power relay circuit 500 includes an array of individual MEMS switches $110_{11}$, . . . , $110_{33}$ for MEMS switch 100.

In general, the array of individual MEMS switches $110_{11}$, . . . , $110_{33}$ can include NS1 individual MEMS switches connected in series (here: NS1=3) and may include NP1 individual MEMS switches connected in parallel (here: NP1=3). NS1 is an integer equal to or greater than 2, i.e. at least two individual MEMS switches may be connected in series within the MEMS switch 110. The larger the number NS1, the greater will be the maximum admissible blocking voltage of the power relay circuit 500. NP1 is an integer equal to or greater than 1. The larger the number NP1, the greater is the maximum admissible load current which can be switched by the power relay circuit 500.

The semiconductor power switch 120 may comprise an array of individual semiconductor power switches $120_{11}$, . . . , $120_{31}$ for semiconductor power switch 120. In general, the array may include NP2 individual semiconductor power switches connected in parallel. The larger the number NP2, the smaller is the electrical resistance of the semiconductor power switch 120, and hence of the power relay circuit 500.

Figure 6:
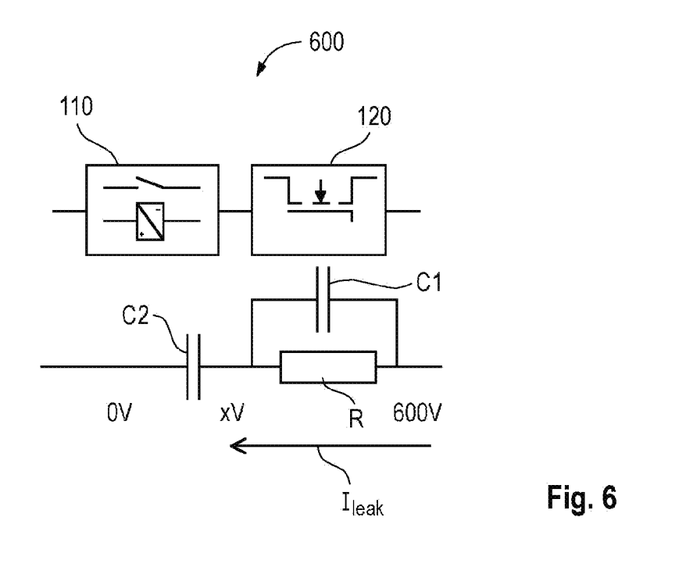
FIG. 6 is a schematic diagram of an equivalent circuit of a power relay circuit.

FIG. 6 is a schematic diagram of an equivalent circuit 600 of a power relay circuit 100, 200, 500. In the equivalent circuit 600 the semiconductor power switch 120 is replaced by a resistance R and a capacitance C1 connected in parallel. The MEMS switch 110 is replaced by a capacitance C2. Therefore, the MEMS switch 110 may behave like a capacitor which is charged by leakage current $I_{leak}$ from the semiconductor power switch 120 when both the MEMS switch and the semiconductor power switch 120 are OFF. In this case, a voltage xV may build up between the MEMS switch 110 and the semiconductor power switch 120. In the example illustrated in FIG. 6, the LS voltage is assumed to be 0 V and the voltage at HS is assumed to be, e.g., 600 V.

Figure 7:
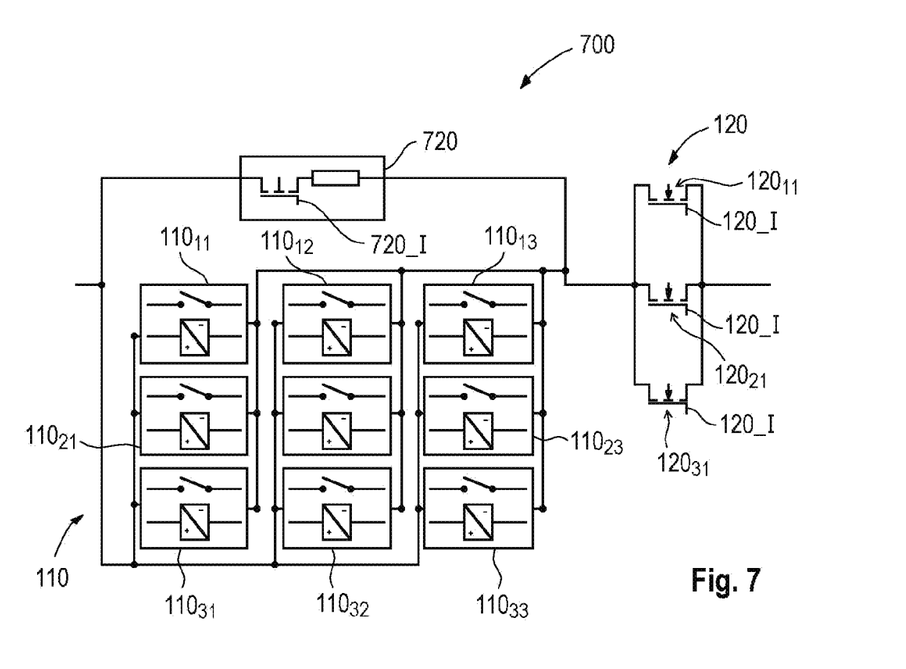
FIG. 7 is a schematic diagram of an exemplary power relay circuit including an auxiliary semiconductor power switch connected in parallel with the MEMS switch.
Figure 8:
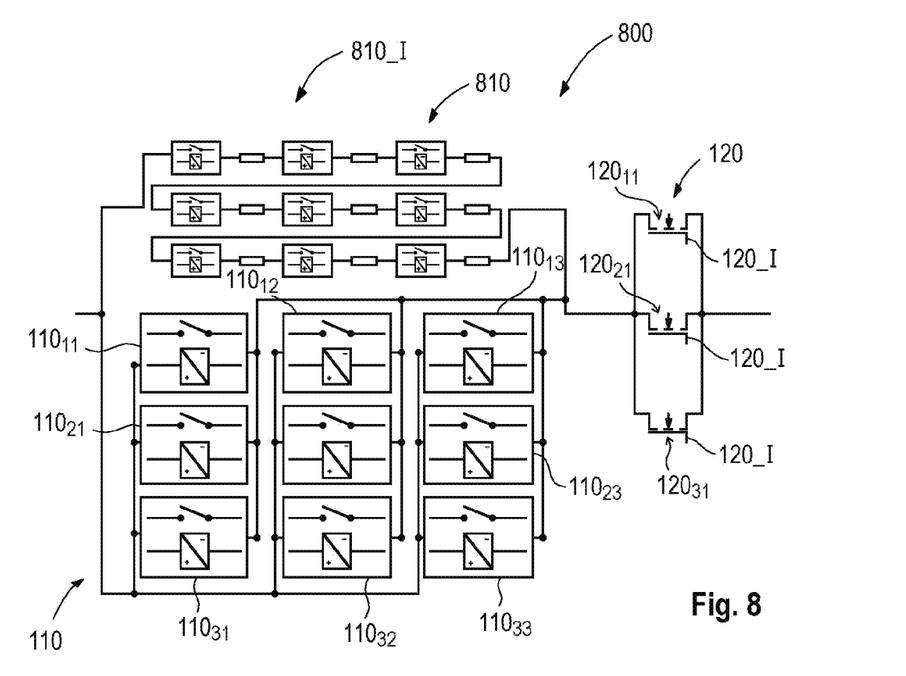
FIG. 8 is a schematic diagram of an exemplary power relay circuit including an auxiliary MEMS switch connected in parallel with the MEMS switch.

As such leakage current $I_{leak}$ could result in an undesired voltage across the MEMS switch 110, an auxiliary switch may be connected in parallel with the MEMS switch 110, see the examples of power relay circuits 700 and 800 in FIGS. 7 and 8, respectively. The auxiliary switches shown in FIGS. 7 and 8 may be used to discharge the MEMS switch 110, i.e. the capacitance C2 of the equivalent circuit of FIG. 6.

Referring to FIG. 7, the auxiliary switch may comprise an auxiliary semiconductor switch 720. The auxiliary semiconductor switch 720 may have an ON-OFF control input 720_I. The ON-OFF control input 720_I may be controlled by, e.g., the driver circuit 130. By way of example, during the connecting operation (see FIG. 4) of the power relay circuit 700, the auxiliary semiconductor switch 720 may be turned ON between T1 and T2. Then, the MEMS switch 110 is already discharged when it is turned ON at T2.

Referring to FIG. 8, the auxiliary switch may comprise an auxiliary MEMS switch 810. The auxiliary MEMS switch 810 may have an ON-OFF control input 810_I which could, e.g., be set by the driver circuit 130. Similarly as described in conjunction with FIG. 7, the auxiliary MEMS switch 810 may be set to ON before setting the ON-OFF control input 110_I of the MEMS switch 110 to ON. Reference is made to the above description for the sake of brevity and in order to avoid reiteration.

As exemplified in FIG. 8, the auxiliary MEMS switch 810 may comprise a plurality of individual auxiliary MEMS switches and resistors (optional) connected in series. The larger the number of individual auxiliary MEMS switches, the higher could be the built-up voltage xV across the MEMS switch 110 to be discharged. The optional resistors may be provided to limit the current and to protect the auxiliary MEMS switch against destruction. The resistors may be designed to allow discharging the capacitance just sufficiently swift to ensure that the MEMS switch 110 is discharged when it is turned ON.

While both auxiliary switches 720, 810 allow to discharge the MEMS switch 110 before turning the MEMS switch 110 ON (FIG. 4, T2), the auxiliary MEMS switch 810 allows for galvanic isolation during the disconnected state (i.e. OFF state) of the power relay circuit 800 while the auxiliary semiconductor switch 720 does not. Therefore, if galvanic isolation is required, the auxiliary MEMS switch 810 may be preferable over the auxiliary semiconductor switch 720.

It is to be noted that the built-up of the voltage xV during the disconnected state of the power relay circuit 100, 200, 500, 700, 800 could be acceptable. Therefore, the auxiliary switches 720, 810 may need only to be activated shortly (e.g. in the order of the switching time duration) before the MEMS switch 110 is to be turned ON at T2.

Figure 9:
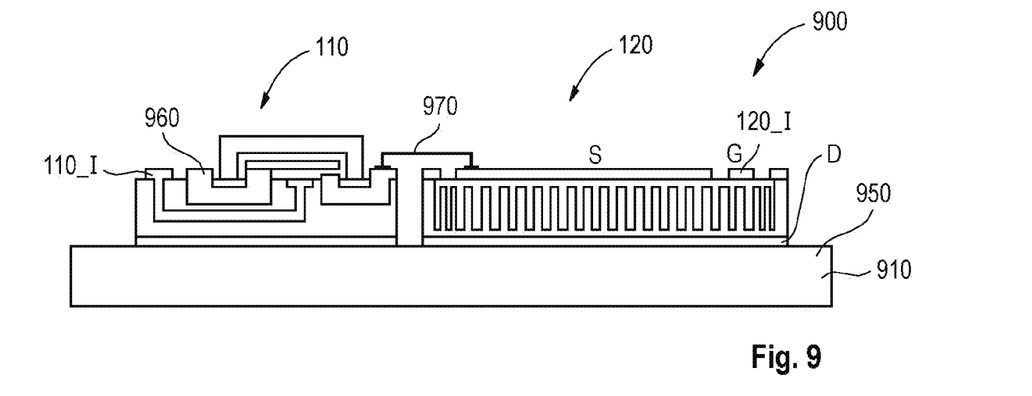
FIG. 9 is an exemplary relay package comprising a power relay circuit and including an electrically conductive carrier on which the MEMS switch and the semiconductor power switch are mounted.

FIG. 9 illustrates an exemplary relay package 900 including a power relay circuit such as, e.g., any one of the power relay circuits 100, 200, 500, 700, 800 described above. The relay package 900 may include an electrically conductive carrier 910. The electrically conductive carrier 910 may, e.g., be a leadframe, a PCB (Printed Circuit Board) or a metal bonded ceramics substrate, e.g. a DCB (Direct Copper Bonded) ceramics substrate.

The MEMS switch 110 and the semiconductor power switch 120 (e.g. a Super-Junction MOSFET) may be mounted side by side on the (common) electrically conductive carrier 910. A second external terminal 960 (e.g. a LS terminal) of the relay package 900 is coupled to the MEMS switch 110. The MEMS switch 110 may be coupled via a conductor 970 to a load electrode (e.g. source S) of the semiconductor power switch 120. Another load electrode (e.g. drain D) of the semiconductor power switch 120 may be connected to the electrically conductive carrier 910. A first external terminal 950 (e.g. a HS terminal) of the relay package 900 may be formed by or connected to the electrically conductive carrier 910, which forms a load current output of the power relay circuit implemented in the relay package 900.

The MEMS switch 110 may be controlled via the ON-OFF control input 110_I and the semiconductor power switch 120 may be controlled via the ON-OFF control input 120_I, e.g. the gate electrode G of the semiconductor power switch 120.

Figure 10:
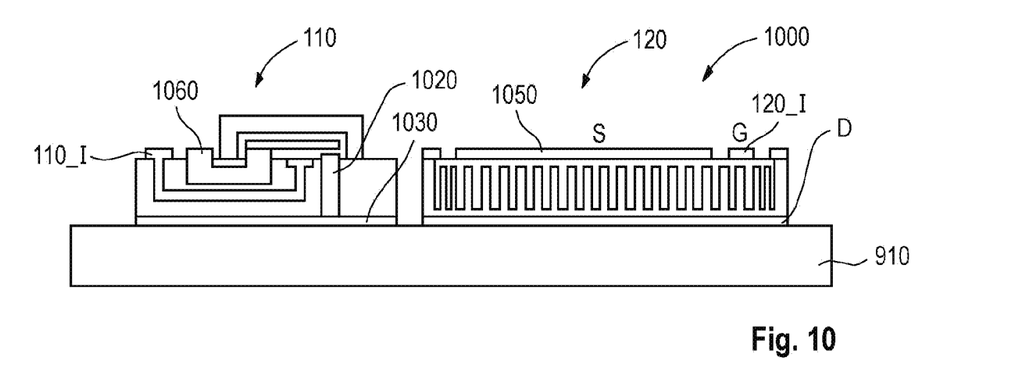
FIG. 10 is an exemplary relay package comprising a power relay circuit and including an electrically conductive carrier on which the MEMS switch and the semiconductor power switch are mounted.

Referring to FIG. 10, a relay package 1000 may have basically the same design as relay package 900, and reference is made to the above description to avoid reiteration. However, relay package 1000 is different from relay package 900 in that the (common) electrically conductive carrier 910 rather than the conductor 970 forms a load current interconnect between the MEMS switch 110 and the semiconductor power switch 120. The MEMS switch 110 may be provided with a via 1020 configured to electrically connect the mechanical contact (airgap contact) of the MEMS switch 110 with a bottom electrode 1030 of the MEMS switch 110. The source S of the semiconductor power switch 120 may be connected to a first external terminal 1050 (e.g. a LS terminal) of the relay package 1000, while the second external terminal 1060 (e.g. a HS terminal) may be connected to the MEMS switch 110 similar as the second external terminal 960 of relay package 900.

Figure 11:
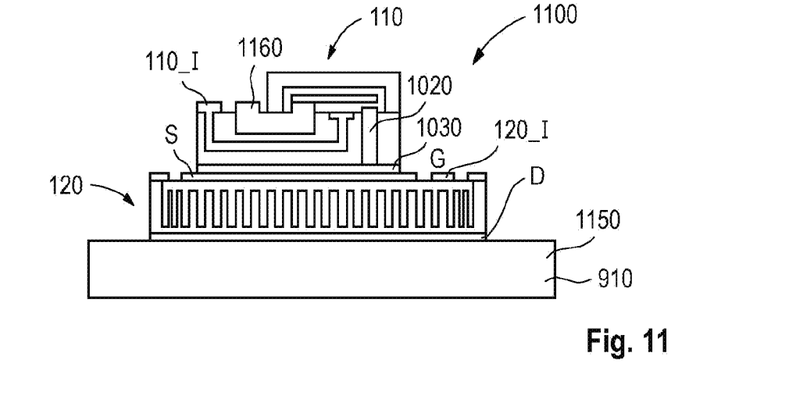
FIG. 11 is an exemplary relay package comprising a power relay circuit and including an electrically conductive carrier on which the semiconductor power switch is mounted, wherein the MEMS switch is mounted over the semiconductor power switch.

Referring to FIG. 11, a relay package 1100 comprising a power relay circuit as described above may have a stacked design, e.g. the MEMS switch 110 may be mounted over the semiconductor power switch 120. The semiconductor power switch 120 may be mounted on the electrically conductive carrier 910. By way of example, the MEMS switch 110 may be directly connected (e.g. soldered) to a load electrode (e.g. source S) of the semiconductor power switch 120. A first external terminal 1150 (e.g. a HS terminal) and a second external terminal 1160 (e.g. a LS terminal) may be similar as the first and second external terminals 950, 960 of relay package 900, respectively. The MEMS switch 110 in relay package 1100 may include a via 1020 similar as the MEMS switch 110 in relay package 1000.

A relay package 1100 comprising a power relay circuit as described above may also have a stacked design wherein the semiconductor power switch 120 is mounted over the MEMS switch 110. In this case (not shown) the MEMS switch 110 may be mounted on the electrically conductive carrier 910.

Figure 12:
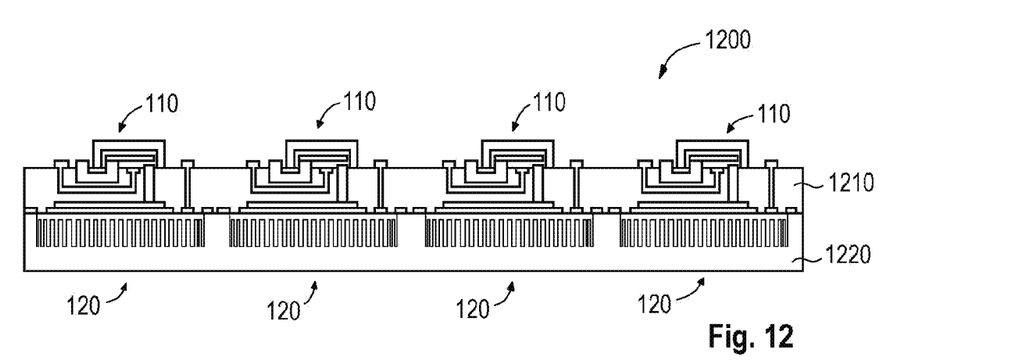
FIG. 12 is an exemplary eWLP wafer composed of a semiconductor power switch layer and a MEMS switch layer.

FIG. 12 illustrates an eWLP wafer 1200. The eWLP wafer 1200 may comprise a first wafer 1220 including a plurality of semiconductor power switches 120. A second wafer 1210 is disposed on the first wafer 1220. The second wafer 1210 may include a plurality of MEMS switches 110. By way of example, one MEMS switch 110 may be disposed over each semiconductor power switch 120. Each MEMS switch 110 and each semiconductor power switch 120 may have any design as described above.

The eWLP wafer 1200 may be produced in a fully integrated process on wafer level. First, the first wafer 1220 is processed to form the array of semiconductor power switches 120 as integrated circuits (ICs). Then, after first wafer 1220 processing, the second wafer 1210 may be generated directly over the first wafer 1220 and processed to form the array of integrated MEMS switches 110. The eWLP wafer 1200 thus comprises a semiconductor power switch layer and a MEMS switch layer. The bulk material of the second wafer 1210 (i.e. of the MEMS switch layer) may comprise or be of an insulating material, e.g. silicon oxide ($SiO_2$).

Figure 13:
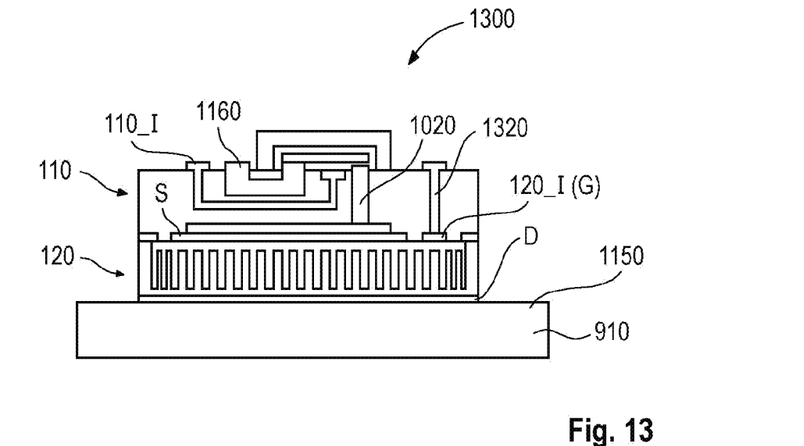
FIG. 13 is an exemplary eWLP relay package comprising a power relay circuit.

After wafer processing is completed, the eWLP wafer 1200 is singularized into eWLP relay packages 1300 as, e.g., illustrated in FIG. 13. The eWLP relay packages 1300 may be similar to relay package 1100 and reference is made to the above description in order to avoid reiteration. However, the MEMS switch 110 may, e.g., include a control via 1320 through which the control input 120_I of the semiconductor power switch 120 is accessible from the periphery of the eWLP relay package 1300. The eWLP relay packages 1300 may be designed with or without electrically conductive carrier 910. In the latter case, the bottom electrode of the semiconductor power switch 120 may form the first external terminal of the eWLP relay package 1300. Further, the stacked design may either comprise that the MEMS switch 110 is mounted over the semiconductor power switch 120 or that the semiconductor power switch 120 is mounted over the MEMS switch 110.

Figure 14:
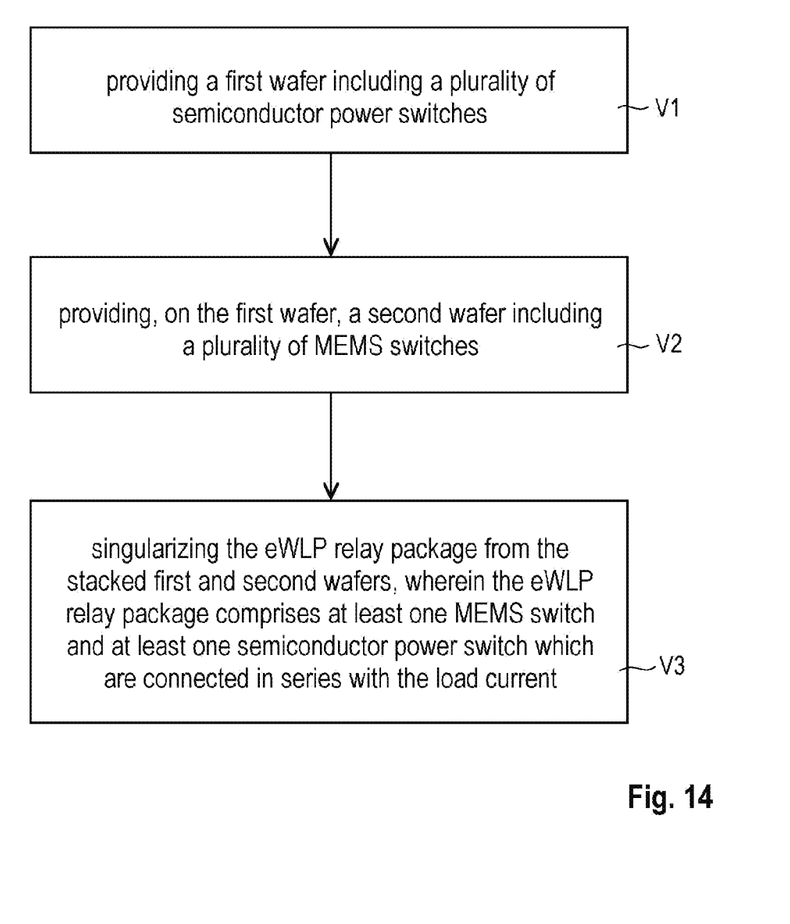
FIG. 14 is a flowchart illustrating an exemplary method of manufacturing an eWLP relay package.

FIG. 14 is a flowchart illustrating a method of manufacturing an eWLP relay package 1300 comprising a power relay circuit for switching a load current.

At V1, a first wafer 1220 including a plurality of semiconductor power switches is provided.

At V2, a second wafer 1210 including a plurality of MEMS switches 110 is provided on the first wafer. Again, V1 and V2 are interchangeable, i.e. the second wafer 1210 may be the support wafer on which the first wafer 1220 is disposed (e.g. generated).

At V3, the eWLP relay packages 1300 are singularized from the stacked first and second wafers, wherein each eWLP relay package 1300 comprises at least one MEMS switch 110 and at least one semiconductor power switch 120 which are connected in series with the load current.

The relay packages 900, 1000, 1100, 1300 as described herein may further include a mold compound (not shown). The mold compound may encapsulate the MEMS switch 110 and the semiconductor power switch 120. The mold compound may comprise or be of an electrically insulating material, e.g. a polymer material such as, e.g., an epoxy resin, a silicone resin or an acrylic resin, etc.

The relay packages 900, 1000, 1100, 1300 allow for a more compact package design than conventional electromechanical relays and may be an adequate replacement of conventional electromechanical relays.

The power relay circuits described herein may be particularly suited for low resistance semiconductor power switches 120, e.g. low resistance MOSFETs or IGBTs. In particular, compensation semiconductor devices, also known as SJ (Super-Junction) devices (e.g. SJ MOSFETSs) may be used. Compensation semiconductor devices take advantage of a field-induced compensation of the doping density in the drift region during the blocking state. They provide for very low conduction and switching losses at high voltages. SJ MOSFETs are vertical devices which may be provided with a rich doped epitaxial n-area and adjacently positioned deep p-columns which run through the major part of the rich doped epitaxial n-area close to, e.g., a bottom side n+ substrate layer forming a back side load contact of the device. The deep p-columns and are effective to balance (compensate) the additional n-charge of the rich doped epitaxial n-area. The rich doped epitaxial n-area provides for the very low ON-state resistance $R_{ON}$ of SJ MOSFETs compared to standard MOSFETs (which are not equipped with a rich doped epitaxial n-area and adjacent deep p-columns). Such compensation semiconductor devices may be capable to block voltages equal to or higher than 400 V or even 600 V.

The power relay circuits may provide for high switching voltages, e.g. voltages equal to or greater than 50 V, 100 V, 200 V, 300 V, 400 V, 500 V, 600 V, 700 V, 800 V etc. The power relay circuits may provide for high switching load currents, e.g. load currents equal to or greater than 5 A, 10 A, 15 A, 20 A, 30 A, 40 A, 50 A, etc.

The following examples pertain to further aspects of the disclosure:

Example 1 is a power relay circuit for switching a load current, the power relay circuit comprising a MEMS switch and a semiconductor power switch; wherein the MEMS switch and the semiconductor power switch are connected in series with the load current.

In Example 2, the subject matter of Example 1 can optionally include a driver circuit configured to receive a power relay circuit control signal and to set an ON-OFF control input of the MEMS switch and an ON-OFF control input of the semiconductor power switch.

In Example 3, the subject matter of Example 2 can optionally include wherein the driver circuit, upon receiving a power relay circuit control signal indicative of disconnecting the power relay circuit, is configured to set the ON-OFF control input of the semiconductor power switch to OFF, and thereafter set the ON-OFF control input of the MEMS switch to OFF.

In Example 4, the subject matter of Example 3 can optionally include wherein the driver circuit, after having set the ON-OFF control input of the MEMS switch to OFF, is configured to set the ON-OFF control input of the semiconductor power switch to ON.

In Example 5, the subject matter of Example 2 can optionally include wherein the driver circuit, upon receiving a power relay circuit control signal indicative of connecting the power relay circuit, is configured to if the MEMS switch (110) is OFF, set the ON-OFF control input of the MEMS switch to ON; and thereafter set the ON-OFF control input of the semiconductor power switch to ON.

In Example 6, the subject matter of any one of the preceding Examples can optionally include an auxiliary switch connected in parallel with the MEMS switch, the auxiliary switch comprising an auxiliary MEMS switch and/or an auxiliary semiconductor power switch.

In Example 7, the subject matter of Examples 5 and 6 can optionally include wherein the driver circuit is further configured to set an ON-OFF control input of the auxiliary switch to ON before setting the ON-OFF control input of the MEMS switch to ON.

In Example 8, the subject matter of any one of the preceding Examples can optionally include wherein the MEMS switch comprises an array of individual MEMS switches, the array including NS1 individual MEMS switches connected in series and NP1 individual MEMS switches connected in parallel, wherein NS1 is an integer equal to or greater than 2 and NP1 is an integer equal to or greater than 1.

In Example 9, the subject matter of any one of the preceding Examples can optionally include wherein the semiconductor power switch comprises an array of individual semiconductor power switches, the array including NP2 individual semiconductor power switches connected in parallel, wherein NP2 is an integer equal to or greater than 2.

Example 10 is a relay package comprising the subject matter of one of the preceding Examples and can optionally include a conductive carrier on which the MEMS switch and the semiconductor power switch are mounted, wherein the conductive carrier forms a load current output contact of the power relay circuit.

Example 11 is a relay package comprising the subject matter of one of the Examples 1 to 9 and can optionally include a conductive carrier on which the MEMS switch and the semiconductor power switch are mounted, wherein the conductive carrier forms a load current interconnect between the MEMS switch and the semiconductor power switch.

Example 12 is a relay package comprising the subject matter of one of the Examples 1 to 9 and can optionally include a conductive carrier on which the semiconductor power switch is mounted, wherein the MEMS switch is mounted over the semiconductor power switch.

Example 13 is a relay package comprising the power relay circuit of one of Examples 1 to 9, wherein the MEMS switch and the semiconductor power switch are stacked on wafer level before eWLP relay package singularization.

Example 14 is a method of switching a load current by a power relay circuit comprising a MEMS switch and a semiconductor power switch, wherein the MEMS switch and the semiconductor power switch are connected in series with the load current, the method comprising: disconnecting the power relay circuit by switching the semiconductor power switch to OFF; and thereafter switching the MEMS switch to OFF; and/or connecting the power relay circuit by switching the MEMS switch to ON; and thereafter switching the semiconductor power switch to ON.

In Example 15 the subject matter of Example 14 can optionally include wherein disconnecting the power relay circuit further comprises after having switched the MEMS switch to OFF, switching the semiconductor power switch to ON.

Example 16 is a method of manufacturing an eWLP relay package, the eWLP relay package comprising a power relay circuit for switching a load current, the method comprising: providing a first wafer including a plurality of semiconductor power switches; providing, on the first wafer, a second wafer including a plurality of micro-electro-mechanical system switches, hereinafter MEMS switches; and singularizing the eWLP relay package from the stacked first and second wafers, wherein the eWLP relay package comprises at least one MEMS switch and at least one semiconductor power switch which are connected in series with the load current.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A power relay circuit for switching a load current, the power relay circuit comprising:
    a micro-electro-mechanical system (MEMS) switch;
    a semiconductor power switch;
    a driver circuit configured to receive a power relay circuit control signal and to set an ON-OFF control input of the MEMS switch and an ON-OFF control input of the semiconductor power switch; and
    an auxiliary switch connected in parallel with the MEMS switch, the auxiliary switch comprising an auxiliary MEMS switch and/or an auxiliary semiconductor power switch,
    wherein the MEMS switch and the semiconductor power switch are connected in series with the load current,
    wherein the driver circuit, upon receiving a power relay circuit control signal indicative of connecting the power relay circuit, is configured to:
        if the MEMS switch is OFF, set the ON-OFF control input of the MEMS switch to ON; and
        thereafter set the ON-OFF control input of the semiconductor power switch to ON,
    wherein the driver circuit is further configured to set an ON-OFF control input of the auxiliary switch to ON before setting the ON-OFF control input of the MEMS switch to ON.

2. The power relay circuit of claim 1, wherein the driver circuit, upon receiving a power relay circuit control signal indicative of disconnecting the power relay circuit, is configured to:
    set the ON-OFF control input of the semiconductor power switch to OFF; and
    thereafter set the ON-OFF control input of the MEMS switch to OFF.

3. The power relay circuit of claim 2, wherein the driver circuit, after having set the ON-OFF control input of the MEMS switch to OFF, is configured to set the ON-OFF control input of the semiconductor power switch to ON.

4. The power relay circuit of claim 1, wherein the MEMS switch comprises an array of individual MEMS switches, the array including NS1 individual MEMS switches connected in series and NP1 individual MEMS switches connected in parallel, and wherein NS1 is an integer equal to or greater than 2 and NP1 is an integer equal to or greater than 1.

5. The power relay circuit of claim 1, wherein the semiconductor power switch comprises an array of individual semiconductor power switches, the array including NP2 individual semiconductor power switches connected in parallel, and wherein NP2 is an integer equal to or greater than 2.

6. A relay package comprising the power relay circuit of claim 1, the relay package further comprising:
    a conductive carrier on which the MEMS switch and the semiconductor power switch are mounted,
    wherein the conductive carrier forms a load current output contact of the power relay circuit.

7. A relay package comprising the power relay circuit of claim 1, the relay package further comprising:
    a conductive carrier on which the MEMS switch and the semiconductor power switch are mounted,
    wherein the conductive carrier forms a load current interconnect between the MEMS switch and the semiconductor power switch.

8. A relay package comprising the power relay circuit of claim 1, the relay package further comprising:
    a conductive carrier,
    wherein the semiconductor power switch is mounted on the conductive carrier and the MEMS switch is mounted over the semiconductor power switch, or the MEMS switch is mounted on the conductive carrier and the semiconductor power switch is mounted over the MEMS switch.

9. An embedded wafer level packaging relay package comprising the power relay circuit of claim 1, wherein the MEMS switch and the semiconductor power switch are stacked at a wafer level prior to singularization of the embedded wafer level packaging relay package.

10. A method of switching a load current by a power relay circuit comprising a micro-electro-mechanical system (MEMS) switch, a semiconductor power switch, a driver circuit configured to receive a power relay circuit control signal and to set an ON-OFF control input of the MEMS switch and an ON-OFF control input of the semiconductor power switch, and an auxiliary switch connected in parallel with the MEMS switch, the auxiliary switch comprising an auxiliary MEMS switch and/or an auxiliary semiconductor power switch, the MEMS switch and the semiconductor power switch being connected in series with the load current, the method comprising:
    disconnecting the power relay circuit by switching the semiconductor power switch to OFF and thereafter switching the MEMS switch to OFF; and/or
    connecting the power relay circuit by switching the MEMS switch to ON and thereafter switching the semiconductor power switch to ON;
    upon receiving a power relay circuit control signal indicative of connecting the power relay circuit, if the MEMS switch is OFF, setting the ON-OFF control input of the MEMS switch to ON and thereafter setting the ON-OFF control input of the semiconductor power switch to ON using the driver circuit; and
    setting an ON-OFF control input of the auxiliary switch to ON before setting the ON-OFF control input of the MEMS switch to ON using the driver circuit.

11. A method of manufacturing an embedded wafer level packaging relay package having a power relay circuit for switching a load current, the method comprising:
  providing a first wafer including a plurality of semiconductor power switches;
  providing, on the first wafer, a second wafer including a plurality of micro-electro-mechanical system (MEMS) switches; and
  singularizing the embedded wafer level packaging relay package from the stacked first and second wafers,
  wherein the embedded wafer level packaging relay package comprises at least one MEMS switch, at least one semiconductor power switch which are connected in series with the load current, a driver circuit configured to receive a power relay circuit control signal and to set an ON-OFF control input of the MEMS switch and an ON-OFF control input of the semiconductor power switch, and an auxiliary switch connected in parallel with the MEMS switch, the auxiliary switch comprising an auxiliary MEMS switch and/or an auxiliary semiconductor power switch,
  wherein the driver circuit, upon receiving a power relay circuit control signal indicative of connecting the power relay circuit, is configured to:
    if the MEMS switch is OFF, set the ON-OFF control input of the MEMS switch to ON; and
    thereafter set the ON-OFF control input of the semiconductor power switch to ON, and
  wherein the driver circuit is further configured to set an ON-OFF control input of the auxiliary switch to ON before setting the ON-OFF control input of the MEMS switch to ON.

* * * * *